(12) United States Patent
Bunker

(10) Patent No.: US 12,278,627 B2
(45) Date of Patent: Apr. 15, 2025

(54) SYNCHRONIZATION OF SENSOR OUTPUT SAMPLES

(71) Applicant: GOOGLE LLC, Mountain View, CA (US)

(72) Inventor: Trevor Scott Bunker, Fremont, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/384,220

(22) Filed: Oct. 26, 2023

(65) Prior Publication Data

US 2024/0063792 A1   Feb. 22, 2024

Related U.S. Application Data

(63) Continuation of application No. 17/056,694, filed as application No. PCT/US2019/062013 on Nov. 18, 2019, now Pat. No. 11,838,018.

(51) Int. Cl.
| | |
|---|---|
| *H03K 17/94* | (2006.01) |
| *G01D 21/02* | (2006.01) |
| *G06F 13/38* | (2006.01) |

(52) U.S. Cl.
CPC ............. *H03K 17/94* (2013.01); *G01D 21/02* (2013.01); *G06F 13/38* (2013.01); *H03K 2217/94094* (2013.01)

(58) Field of Classification Search
CPC ......... H03K 17/94; H03K 2217/94094; G01D 21/02; G06F 13/38
See application file for complete search history.

(56) References Cited

U.S. PATENT DOCUMENTS

| 6,147,631 A  * | 11/2000 | Maulik ................... H03M 3/35 341/122 |
| 2007/0095142 A1 | 5/2007 | Samson, Jr. |

(Continued)

FOREIGN PATENT DOCUMENTS

| CN | 102624367 | 8/2012 |
| CN | 106662462 | 5/2017 |

(Continued)

OTHER PUBLICATIONS

International Preliminary Report on Patentability in International Appln. No. PCT/US2019/062013, dated Jun. 2, 2022, 9 pages.

(Continued)

*Primary Examiner* — Jung Kim
(74) *Attorney, Agent, or Firm* — Fish & Richardson P.C.

(57) ABSTRACT

A system includes multiple sensors and, for each sensor, a respective sensor controller of multiple sensor controllers. Each sensor controller is configured to implement a respective decimation filter that is configured to generate a single output value from multiple input samples generated by a corresponding sensor of the multiple sensors. The system further includes a master sensor controller of the multiple sensor controllers, which is configured to generate a sync signal upon receiving a threshold number of input samples. Each sensor controller other than the master sensor controller is configured to monitor sync signals generated by the master sensor controller and to provide an output value generated from input samples upon determining that the master sensor controller generated a sync signal.

20 Claims, 4 Drawing Sheets

(56) References Cited

U.S. PATENT DOCUMENTS

| | | |
|---|---|---|
| 2008/0309774 A1 | 12/2008 | Goh et al. |
| 2011/0234813 A1 | 9/2011 | Baecher et al. |
| 2012/0182160 A1 | 7/2012 | Hod |
| 2013/0322462 A1 | 12/2013 | Poulsen |
| 2016/0174099 A1 | 6/2016 | Goldfain |
| 2016/0236637 A1 | 8/2016 | Krishna et al. |
| 2017/0122771 A1 | 5/2017 | Keal et al. |
| 2017/0220502 A1 | 8/2017 | Kessler et al. |

FOREIGN PATENT DOCUMENTS

| | | |
|---|---|---|
| CN | 106896745 | 6/2017 |
| CN | 109766031 | 5/2019 |
| JP | 2018-191248 | 11/2018 |
| JP | 2019-096397 A | 6/2019 |
| TW | 200907823 | 2/2009 |
| TW | 201519063 | 5/2015 |
| WO | WO 2014136420 | 9/2014 |

OTHER PUBLICATIONS

International Search Report and Written Opinion in International Appln. No. PCT/US2019/062013, dated Jul. 27, 2020, 14 pages.

Office Action in Indian Appln. No. 202227008632, dated Jul. 19, 2022, 6 pages (with English translation).

Office Action in Japanese Appln. No. 2022-517455, dated May 15, 2023, 6 pages (with English translation).

Office Action in Taiwanese Appln. No. 109140378, dated Sep. 28, 2021, 12 pages (with English translation).

Office Action in Taiwanese Appln. No. 111130633, dated Feb. 16, 2023, 9 pages (with English translation).

Office Action in Chinese Appln. No. 201980100448.1, dated Mar. 6, 2024, 12 pages (with English translation).

Extended European Search Report in European Appln. No. 23206486.5, dated Jan. 22, 2024, 7 pages.

Office Action in European Appln. No. 23206486.5, mailed on Feb. 19, 2025, 6 pages.

* cited by examiner

SYNCHRONIZATION OF SENSOR OUTPUT SAMPLES

CROSS-REFERENCE TO RELATED APPLICATIONS

This application is a continuation of U.S. patent application Ser. No. 17/056,694 filed Nov. 18, 2020, which is a National Stage Application under 35 U.S.C. § 371 and claims the benefit of International Patent Application No. PCT/US2019/062013, filed Nov. 18, 2019, the disclosures of which are incorporated herein by reference.

BACKGROUND

This specification relates to signal processing, and more particularly to synchronizing multiple signals generated by devices having multiple sensors.

Modern electronic devices, e.g., smartphones and tablets, can include multiple sensors, and each sensor may begin sensing an environment of the device at different times. For example, if the device is a mobile phone, when a user is holding the device up to their ear, the device may activate only one microphone located at the bottom of the phone near the user's mouth. When instead the device is operating in a speakerphone mode, the device can have multiple microphones activated. Therefore, when switching from a non-speakerphone mode to a speakerphone mode, the device can activate microphones in addition to those that are already active. To ensure that the output samples from the multiple sensors reflect the environment at the same time, the device can use timestamp-based synchronization in order to align samples, e.g., through interpolation. However, these methods may not be a good reflection of actual data, and may be dependent on accurate (e.g., low-skew) and high-resolution timers. Because such timers can be costly and draw significant power, it is advantageous for an electronic device to not include them. In addition, circuits used to distribute the signals generated by such timers can be complex and prone to inaccuracies and these circuits can be omitted if the timers are omitted. Another challenge associated with these methods is that samples may be lost during the synchronization process, which may lead to unwanted distortion of the sensor data.

SUMMARY

A hardware solution for synchronizing sensor output samples is described. The disclosed subject matter includes a sensor controller for each sensor of a device. When a sensor is enabled, its corresponding sensor controller receives input samples from the sensor. When multiple sensors are enabled, at least one of the corresponding sensor controllers can operate as a master sensor controller that outputs a sync signal according to a predetermined sampling rate. Each remaining sensor controller that is receiving input samples from a sensor can operate as a non-master sensor controller that reads from a common bus to determine whether the master sensor controller has output the sync signal. If the master sensor controller has not output the sync signal, each non-master sensor controller can store the input samples received from its respective sensor in a sensor controller data storage. If instead the master sensor controller outputs the sync signal, each non-master sensor controller can generate an output value using the input samples received from its respective sensor, including the input samples stored in its sensor controller data storage. The master sensor controller can also store input samples and generate an output value together with the non-master sensor controllers.

In general, in a first aspect, a system includes multiple sensors and, for each sensor, a respective sensor controller of multiple sensor controllers. Each sensor controller is configured to implement a respective decimation filter that is configured to generate a single output value from multiple input samples generated by a corresponding sensor of the multiple sensors. The system further includes a master sensor controller of the multiple sensor controllers, which is configured to generate a sync signal upon receiving a threshold number of input samples. Each sensor controller other than the master sensor controller is configured to monitor sync signals generated by the master sensor controller and to provide an output value generated from input samples upon determining that the master sensor controller generated a sync signal.

Implementations of the system can include one or more of the following features. For example, each sensor controller can include a programmable register space that includes a mode value indicating whether or not the sensor controller is a master sensor controller. In some implementations, the programmable register space includes a sync mask that indicates which sensor controller to monitor for sync signals. In some implementations, the programmable register space includes an enable value indicating whether the sensor controller should generate output values.

In some implementations, each sensor controller is configured to perform a mode switching process upon detecting an update to the programmable register space. Performing the mode switching process by a particular sensor controller can include determining that the mode value for the particular sensor controller indicates that the particular sensor controller should be a master sensor controller, and in response, assuming a role as the master sensor controller. Assuming the role as the master sensor controller can include generating one or more output values without waiting for any sync signals from any other sensor controllers.

In some implementations, performing the mode switching process by a particular sensor controller includes determining that the mode value for the particular sensor controller indicates that the particular sensor controller should be a non-master sensor controller, and in response, assuming a role as a non-master sensor controller. Assuming the role as the non-master sensor controller can include waiting to generate any output values until a sync signal is received from a new master sensor controller.

The multiple sensors can include one or more of audio sensors, light sensors, or proximity sensors. The multiple sensors can include both audio sensors and light sensors.

In another aspect, the invention includes a method performed by a device having a master sensor controller of multiple sensor controllers, wherein each sensor controller of the multiple sensor controllers is configured to implement a respective decimation filter that is configured to generate a single output value from multiple input samples generated by a corresponding sensor of multiple sensors. The method includes receiving an input sample from a sensor of the multiple sensors. The method further includes determining whether a threshold number of input samples has been received by the sensor controller. The method also includes outputting a sync signal if the result of the determining is a determination that the threshold number of input samples has been received by the sensor controller. The method further includes generating an output value using one or more of the received input samples and outputting the output sample.

Implementations of the method can include one or more of the following features. For example, each sensor controller of the multiple sensor controllers can include a programmable register space that includes a mode value indicating whether or not the sensor controller is a master sensor controller. The programmable register space can include a sync mask that indicates which sensor controller to monitor for sync signals. The programmable register space can include an enable value indicating whether the sensor controller should generate output values.

In some implementations, the method further includes determining, by a sensor controller, that the mode value for the sensor controller indicates that the sensor controller should be a non-master sensor controller and in response, assuming a role as a non-master sensor controller. Assuming the role as the non-master sensor controller can include waiting to generate any output values until a sync signal is received from a new master sensor controller.

In some implementations, the method further includes determining, by the sensor controller, that the mode value for the sensor controller indicates that the sensor controller should be a master sensor controller and in response, assuming a role as a master sensor controller.

In some implementations, the method can further include storing the input sample in a sensor controller data storage if the result of the determining is a determination that the threshold number of input samples has not been received by the sensor controller.

In some implementations, outputting a sync signal includes writing to a bus to which each sensor controller of the multiple sensor controllers is communicatively coupled.

In another aspect, the invention includes a method performed by a system that includes multiple sensors and, for each sensor, a respective sensor controller of multiple sensor controllers, wherein each sensor controller is configured to implement a respective decimation filter that is configured to generate a single output value from multiple input samples generated by a corresponding sensor of the multiple sensors. The method includes generating, by a master sensor controller of the multiple sensor controllers, a sync signal upon receiving a threshold number of input samples. The method further includes monitoring, by each sensor controller other than the master sensor controller, sync signals generated by the master sensor controller. The method further includes providing, by each sensor controller other than the master sensor controller, an output value generated from input samples upon determining that the master sensor controller generated a sync signal.

Among other advantages, embodiments feature methods and systems that allow output samples from multiple sensors to be synchronized using a dynamically-programmable hardware interface. The number of input samples stored by a master sensor controller data storage before it outputs a sync signal reflects the desired sampling rate of the sensor controllers. The number of input samples can be changed dynamically, allowing the sampling rate to be programmed dynamically, e.g., to achieve a sampling rate tailored to a type and/or number of sensors. In addition, while conventional synchronization schemes may include controllers that operate regardless of the number of sensors that are enabled, the disclosed subject matter can be used to selectively operate a sensor controller only when the sensor controller is needed, i.e., only when the sensor corresponding to the sensor controller is enabled. Therefore, the disclosed subject matter can be used to reduce the power consumption of a device compared to one that uses a conventional synchronization scheme. Yet another advantage is that the subject matter provides a high-fidelity method of synchronization that is less likely to lose samples and provides faster mode switching, as compared to a conventional synchronization scheme. Furthermore, embodiments of the described systems can include circuitry that is simpler than circuitry required by conventional synchronization schemes, such that the described systems can be more easily integrated into an embedded circuit than conventional systems.

Other advantages will be evident from the description, drawings, and claims.

BRIEF DESCRIPTION OF THE DRAWINGS

Like reference symbols in the various drawings indicate like elements.

DETAILED DESCRIPTION

Figure 1:
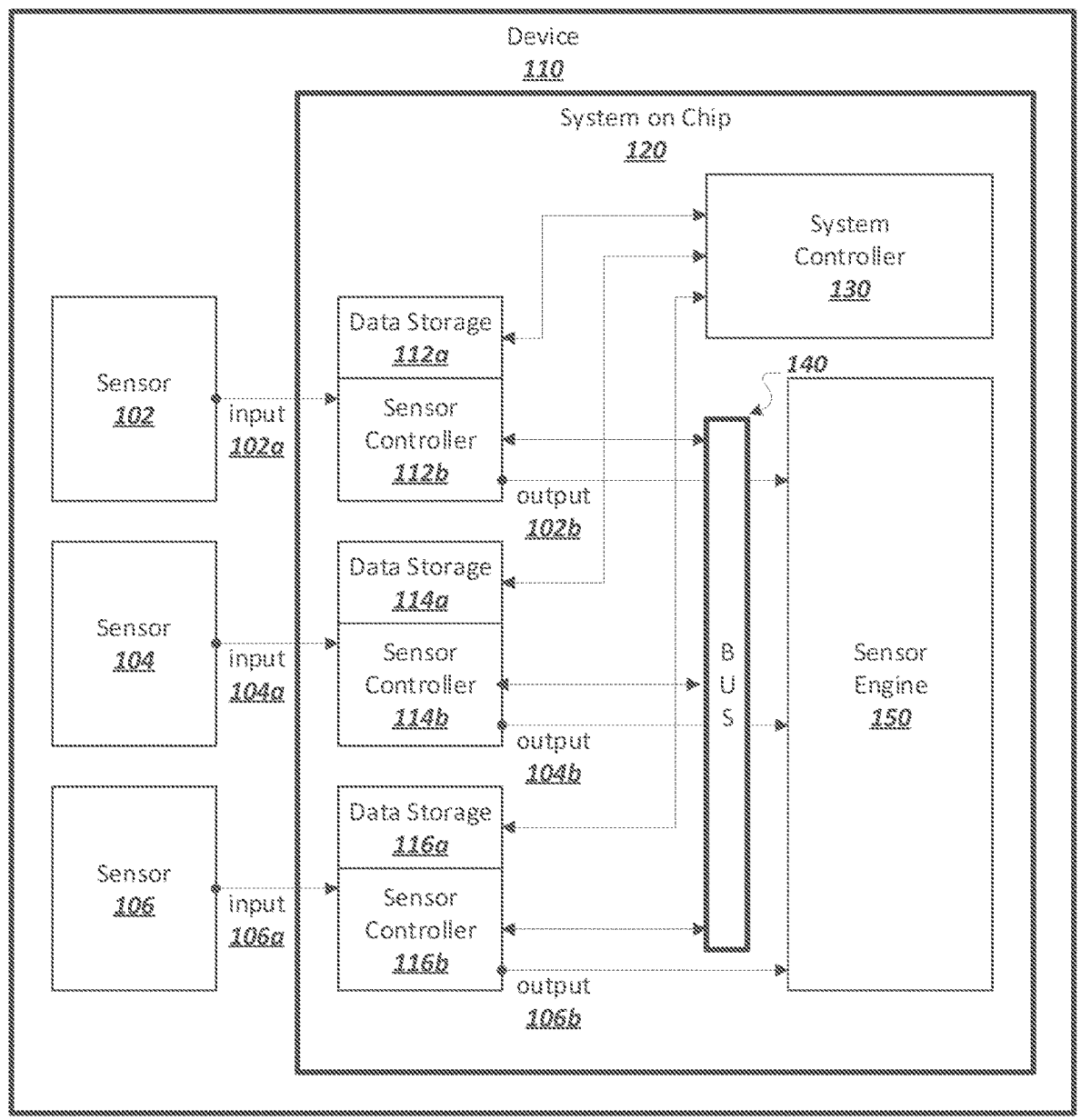
FIG. 1 is a diagram of a device that includes multiple sensors and a corresponding number of sensor controllers.

FIG. 1 is a diagram of a device 110 that includes multiple sensors 102, 104, and 106 and a corresponding number of sensor controllers 112*b*, 114*b*, and 116*b*. Referring to FIG. 1, a device 110 includes sensors 102, 104, and 106, communicatively coupled to a system on a chip (SoC) 120, which further includes sensor controllers 112*b*, 114*b*, and 116*b*, a system controller 130, a bus 140, and a sensor engine 150. Each sensor controller is communicatively coupled to the system controller 130, the bus 140, and the sensor engine 150.

Sensors 102, 104, and 106 can be any appropriate sensor that is capable of receiving information about an environment of the device 110 and outputting samples that corresponds to the received information. For example, sensors 102, 104, and 106 can be proximity sensors, audio sensors, such as microphones, electromagnetic radiation sensors, such as infrared sensors, visible light sensors, or flicker sensors, radar sensors, or a combination of one or more types of sensors. The information received by the sensors can be filtered by a sensor controller and output to the sensor engine 150 for processing.

While a sensor may sample information at a first sampling rate and output samples at the first sampling rate, the sensor engine 150 may operate at a different, e.g., lower, sampling rate. Therefore, for a sensor to communicate the information to the sensor engine 150, the samples output by the sensor can be decimated, or downsampled, before being sent to the sensor engine 150. This can be achieved using pulse-density modulation (PDM) interfaces, which can be a digital serial interface used to communicate oversampled data from one domain, e.g., the sensor output domain, to another domain, e.g., a sensor engine domain.

Each sensor 102, 104, and 106 can output samples to a corresponding sensor controller 112*b*, 114*b*, and 116*b*. Each corresponding sensor controller 112*b*, 114*b*, and 116*b* can receive the samples, labeled input 102a, 102b, and 102c and use the input samples, when it is time to sync its output with the other sensor controllers, to generate an output value 102b, 104b, and 106b. When it is not time to sync its output, each sensor controller 112b, 114b, and 116b, can store the input samples in a respective sensor controller data storage 112a, 114a, and 116a. Instead of storing the input samples, each sensor controller can discard the samples when it is not time to sync its output.

A sensor controller is said to be enabled when it is receiving samples from a sensor and either generating an output value or storing the input samples in a corresponding sensor controller data storage (or simply, data storage). When enabled, a sensor controller can operate in a master mode, a non-master mode, or a disabled mode. Each sensor controller can include a programmable register space that can store data that represents whether the sensor controller is enabled and/or a mode value indicating the mode of the sensor controller. In some implementations, the mode value indicates whether or not the sensor controller is a master sensor controller.

The system controller 130 can generally determine which sensor controllers are enabled and in what mode each sensor controller should operate. The system controller 130 can also enable a sensor controller or set a mode of a sensor controller. For example, in response to information that a sensor has switched from a disabled to an enabled state, e.g., because a user of device 110 has activated a certain mode of the device such as a speaker mode, the system controller can enable the sensor controller corresponding to the newly-enabled sensor. Enabling the sensor controller can include setting an enable value of the sensor controller's programmable register space to an enabled value. The system controller 130 can also change the mode of a sensor controller by setting a mode value of the sensor controller's programmable register space to a certain mode, e.g., a master mode or non-master mode.

Regardless of the mode in which a sensor controller is operating, each sensor controller can read from and write to bus 140. When a sensor controller is operating in a master mode, it is configured to output a sync signal to the bus 140, which can be read by each non-master sensor controller. After outputting the sync signal, the master sensor controller can output to the sensor engine 150 an output value that includes data received from its respective sensor. The sync signal triggers each non-master sensor controller to output its own sample, i.e., using the input samples received from their respective sensors, to the sensor engine 150.

Each sensor controller sends its output value to the sensor engine 150, which processes the output values. For example, the sensor engine 150 can combine the output values into a single value for a particular downstream application. If the output values are audio values, for example, the sensor engine 150 can generate a single audio value from each of the different output values. The sensor engine 150 can use any appropriate processing technique to combine the different output values. In some implementations, the output generated by the sensor engine 150 is output by device 110, e.g., as audio output by one or more speakers of the device. In other implementations, the output of the sensor engine 150 can be displayed by an electronic display of device 110, e.g., as an image or another representation of the environment of the device.

Figure 2:
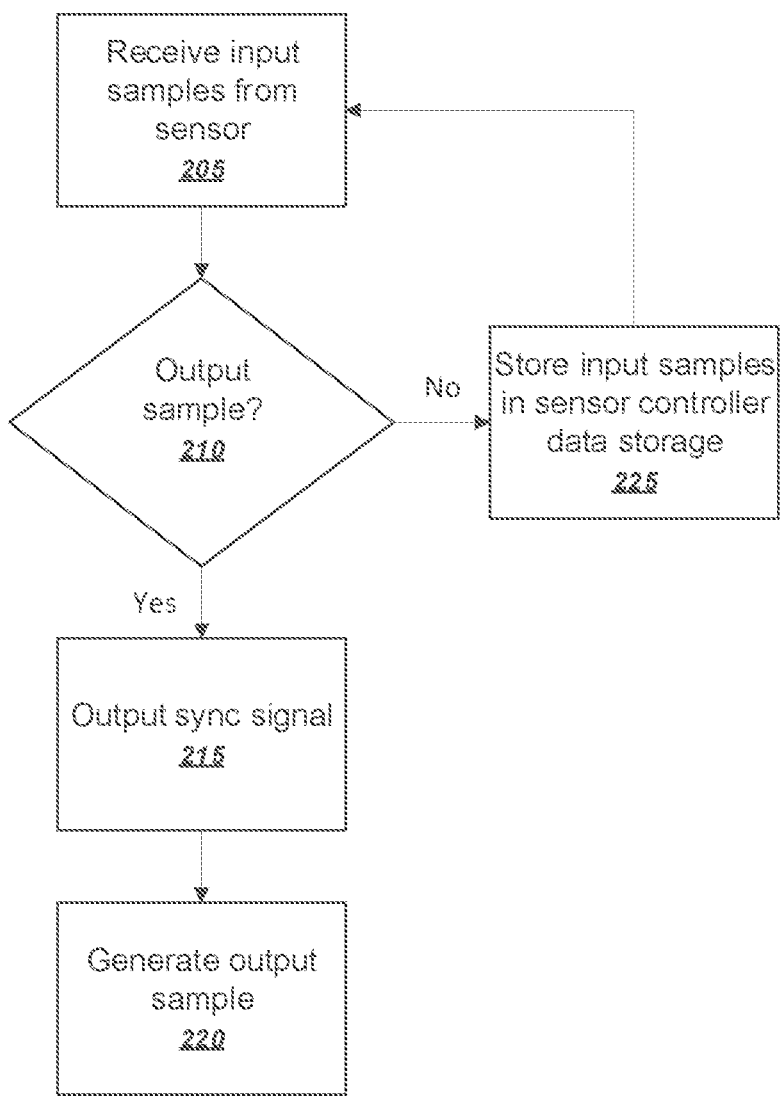
FIG. 2 is a flowchart that describes operations that can be performed by a master sensor controller during an example synchronization cycle.

FIG. 2 is a flowchart 200 that describes operations that can be performed by a master sensor controller during an example synchronization cycle. For example, a synchronization cycle lasts from when the sensor controller receives input samples from its corresponding sensor, to when the sensor controller generates an output value. The flowchart is described as being performed by a master sensor controller configured according to this specification, e.g., a sensor controller, such as sensor controller 112b, 114b, or 116b, which is operating in a master mode. The master sensor controller is part of a device that includes one or more sensors and a corresponding number of sensor controllers.

The master sensor controller receives input samples from a sensor (205). The master sensor controller is communicatively coupled to a sensor that receives information about an environment of the device and outputs samples to the master sensor controller. The sensor outputs data sampled by the sensor at a higher sampling rate than that of the processor that is used to process the data e.g., a sensor engine. Accordingly, the master sensor controller can direct the decimation of the data by a predetermined decimation factor, i.e., the ratio of the input sampling rate to the desired, output sampling rate. Prior to decimation, the system controller can configure the master sensor controller to downsample the data according to the decimation factor. That is, the system controller can determine the sample size, i.e., a number of input samples that is collected by the master sensor controller before the controller generates and outputs a sample.

The master sensor controller determines whether to output a sample (210). The master sensor controller determines whether a threshold number of input samples has been received by the controller. For example, the threshold number of input samples can be equal to the sample size.

If in stage 210 the master sensor controller determines it is time to output a sample (i.e., the "yes" branch), the master sensor controller outputs a sync signal (215). When the master sensor controller determines that the threshold number of input samples has been received, the controller outputs a sync signal to a signal bus from which one or more non-master sensor controllers read. The sync signal alerts the one or more non-master sensor controllers that a sample should be generated, e.g., in the clock cycle following the one in which the master sensor controller outputs the sync signal.

As an example, the sync signal can be encoded onto a sync mask that includes a bit corresponding to each sensor controller of the device. The bit corresponding to the master sensor controller can take on either a high or a low value, while the bits corresponding to the non-master sensor controllers are set as low values.

The sync mask can be a one-hot signal, such that when it is time to output a sample, the master sensor controller outputs to the signal bus a sync mask containing a high value corresponding to its bit and low values for each of the one or more non-master sensor controller bits. When it is not time to output a sample, the master sensor controller can output to the signal bus a sync mask containing all low values. Each non-master sensor controller reads the sync mask from the signal bus and uses the mask to determine whether to output a sample.

In some implementations, each sensor controller contains a value that indicates which sensor controller to monitor for a sync signal. For example, when the sync mask is a one-hot signal, the value can indicate which bit, and accordingly, which sensor, to monitor. The value can be stored in a programmable register space of each sensor.

The master sensor controller generates a sample output (220). The master sensor controller uses the input samples received from the sensor to generate an output value, which the controller communicates to the sensor engine. The master sensor controller can perform one or more calculations on the input samples when generating the sample output. For example, the master sensor controller and each non-master sensor controller can include a decimation filter that is configured to generate a single output value from multiple input samples generated by the sensor controller's respective sensor.

If in stage 210 the master sensor controller determines it is not time to output a sample (i.e., the "no" branch), the master sensor controller stores the input samples received from the sensor in a sensor controller data storage (225). The sensor controller data storage can store input samples received from the sensor until the threshold number of input samples to generate a sample has been received.

Figure 3:
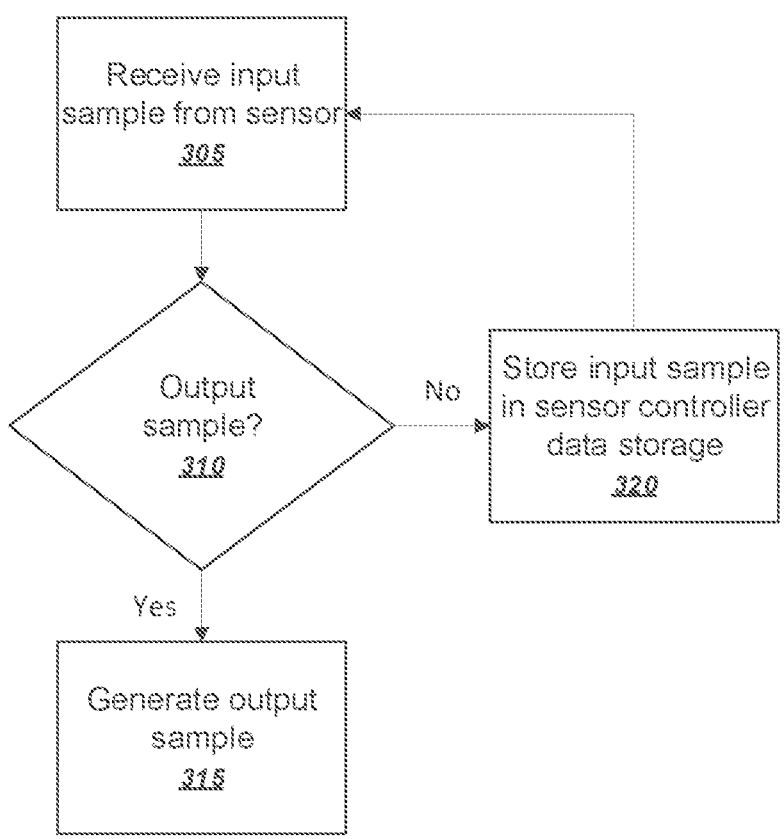
FIG. 3 is a flowchart that describes operations that can be performed by a non-master sensor controller during the example synchronization cycle of FIG. 2.

While FIG. 2 describes operations performed by an example master sensor controller, FIG. 3 is a flowchart 300 that describes operations performed by an example non-master sensor controller during an example synchronization cycle. The flowchart is described as being performed by a non-master sensor controller configured according to this specification, e.g., a sensor controller, such as sensor controller 112b, 114b, or 116b, which is operating in a non-master mode. The non-master sensor controller is part of a device that includes one or more sensors and a corresponding number of sensor controllers.

The non-master sensor controller receives input samples from a sensor (305). Like the master sensor controller, the non-master sensor controller is communicatively coupled to a sensor that receives information about an environment of the device and outputs samples to the non-master sensor controller.

The non-master sensor controller determines whether to output a sample (310). The non-master sensor controller determines whether to output a sample using a signal received from the signal bus. For example, the non-master sensor controller can read a sync mask from the signal bus to determine whether the master sensor controller has output a sync signal.

If in stage 310 the non-master sensor controller determines that it is time to output a sample (i.e., the "yes" branch), the non-master sensor controller generates a sample output (315). Like the master sensor controller, the non-master sensor controller can perform one or more calculations on the input samples received from its respective sensor to generate the sample output, which the non-master sensor controller communicates to the sensor engine.

If in stage 310 the non-master sensor controller determines that it is not time to output a sample, the non-master sensor controller stores the input samples received from its respective sensor in its controller data storage (branch to 320). The non-master sensor controller can store the input samples received from its corresponding sensor in its sensor controller data storage.

In some situations, the non-master sensor controller may need to discard samples rather than storing them. For example, when a sensor switches from being disabled to being enabled, one or more input samples received from the sensor may not be synchronized with the input samples being received by the current master sensor controller. Therefore, the non-master sensor controller corresponding to the newly-enabled sensor can discard the out-of-sync input samples. When the non-master sensor controller receives a sync signal from the master sensor controller, the non-master sensor controller can stop discarding the input samples and begin storing the samples in its controller data storage.

Figure 4:
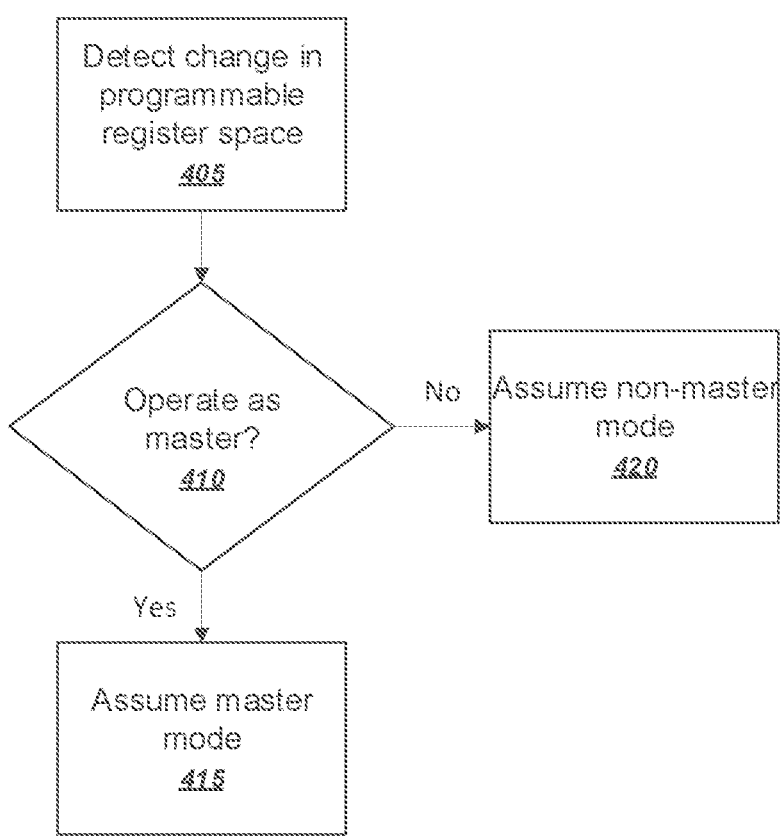
FIG. 4 is a flowchart that describes operations that can be performed by a sensor controller when the sensor controller detects a change in its programmable register space.

FIG. 4 is a flowchart that describes operations that can be performed by a sensor controller when the sensor controller detects a change in its programmable register space. The flowchart is described as being performed by a sensor controller configured according to this specification, e.g., a sensor controller, such as sensor controller 112b, 114b, or 116b. The sensor controller is part of a device that includes one or more sensors and a corresponding number of sensor controllers. In the example of FIG. 4, the sensor controller may begin in a master mode, a non-master mode, or neither mode. For example, the sensor controller may be disabled i.e., it is not receiving or storing input samples from a corresponding sensor of the device (e.g., because the sensor is not receiving information about the environment of the device) and therefore the sensor is in neither the master nor the non-master mode.

As an example, the device may be a mobile phone that includes two sensors: a first microphone positioned at the top of the phone and a second microphone positioned at the bottom of the phone. When the phone is in a speaker mode, it may operate both microphones simultaneously to maximize the audio input received by the device. When instead the phone is in a non-speaker mode, it may operate only one of the two microphones. When transitioning from a non-speaker to a speaker mode, a system controller of the mobile device can enable the disabled speaker so that it begins receiving audio input from the environment of the mobile phone.

The sensor controller detects an update in its programmable register space (405). For example, a system controller can enable the sensor controller by changing an enable value of its programmable register space from a disabled value to enabled value e.g., in response to the system controller detecting that a sensor corresponding to the sensor controller has been enabled. As another example, the system controller may change the mode value stored in the programmable register space of the sensor controller.

In some implementations, instead of or in addition to detecting an update in the programmable register space, the sensor controller can detect a change in the sensor controller data storage. For example, the change in the data storage may result from the corresponding sensor of the sensor controller going from a disabled to an enabled state. Once enabled, the sensor can receive information about the environment of the device and send input samples to the sensor controller data storage.

The sensor controller determines whether to operate as a master sensor controller (410). For example, the sensor controller can set the mode value of the sensor controller to be a master mode value. The sensor controller can read the mode value from its programmable register space.

If in stage 410 the sensor controller determines that it should operate in a master mode, the sensor controller assumes the master mode (415). Because the master sensor controller is configured to output a sample at a predetermined sampling rate, as part of assuming the master mode, the system controller can communicate the sampling rate to the sensor controller.

It may be unnecessary for the device to have more than one sensor controller operating as a master at the same time. If another, different sensor controller of the device is currently operating as a master, then the operations of stage 415 can include the sensor controller synchronizing with the different sensor controller, that is, the "new" master sensor controller synchronizes with the "old" master sensor controller. For example, the new master sensor controller can receive input samples from its corresponding sensor and read data from the signal bus. While the old master sensor controller has not written a sync signal to the signal bus, the new master sensor controller can store the input samples received from its respective sensor in its data storage, e.g., as in stage 225. When the new master sensor controller reads a sync signal from the signal bus, the new master sensor controller generates an output value.

After generating an output value, the new master sensor controller begins storing input samples in its sensor controller data storage (e.g., stage 225) and outputting a sync signal (e.g., stage 215) according to the sampling rate communicated to it by the system controller. Once the new master sensor controller has synchronized sampling rates with the old master sensor controller, the old master sensor controller transitions to either the non-master mode or to a disabled mode, if the sensor corresponding to the old master sensor controller is disabled.

In some implementations, the new master sensor controller does not sync with the old master sensor controller. For example, as one of the operations of stage 415, when the sensor controller assumes the master role, the new master sensor controller may begin storing input samples in its sensor controller data storage (e.g., stage 225) and outputting a sync signal (e.g., stage 215) according to the sampling rate, while the old master sensor controller may transition to a non-master mode or to a disabled mode.

In some implementations, the new master sensor controller does not sync with the old master sensor controller and the operations of stage 415 include the new master sensor controller outputting a sync signal (e.g., stage 215). In these implementations, following the output of the sync signal, each sensor controller can output a sample that includes whatever input samples the sensor controller has stored in its respective sensor controller data storage. The operations of stage 415 can further include the old master sensor controller transitioning to a non-master mode or to a disabled mode. In these implementations, the initial output value following the operations of stage 415 may be generated without the sensor controllers having received the threshold number of input samples, although the following output values are generated after the new master sample controller has received the threshold number of input samples.

The example process can thus achieve signal synchronization without relying substantially on a software routine or on timestamps, thereby resulting in faster synchronization. Furthermore, the example process achieves signal synchronization without dropping as many samples as are dropped when using timestamps or software routines that stall the decimation process until a particular timestamp indicates that outputs should be generated again.

If in stage 410 the sensor controller determines that it should not operate in a master mode, the sensor controller assumes the non-master role (420). Assuming the non-master role can include performing the actions of flowchart 300, e.g., waiting to generate any output value until a sync signal is received from the new master sensor controller.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application specific integrated circuit). The apparatus can optionally include, in addition to hardware, code that creates an execution environment for computer programs, e.g., code that constitutes processor firmware, a protocol stack, a database management system, an operating system, or a combination of one or more of them.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method performed by a device having a plurality of sensor controllers, wherein each sensor controller of the plurality of sensor controllers is configured to implement a respective decimation filter that is configured to generate a single sample output from multiple input samples generated by a corresponding sensor of a plurality of sensors, the method comprising:

while monitoring for a sync signal from a master sensor controller of the plurality of sensor controllers, receiving and storing, by a non-master sensor controller of the plurality of sensor controllers, a plurality of input samples from the corresponding sensor;

upon receiving the sync signal from the master sensor controller, generating, by the non-master sensor controller, a sample output representative of the plurality of input samples received by the sensor while monitoring for the sync signal, wherein generating the sample output comprises applying the respective decimation filter of the non-master sensor controller to the plurality of input samples; and outputting, by the non-master sensor controller, the sample output generated from the plurality of input samples received while monitoring for the sync signal from the master sensor controller.

2. The method of claim 1, wherein each sensor controller of the plurality of sensor controllers comprises a programmable register space comprising a mode value indicating whether or not the sensor controller is the master sensor controller.

3. The method of claim 2, wherein the programmable register space comprises a sync mask that indicates which sensor controller to monitor for sync signals.

4. The method of claim 2, wherein the programmable register space comprises an enable value indicating whether the sensor controller should generate output values.

5. The method of claim 2, further comprising:
determining, by the master sensor controller, that the mode value for the master sensor controller indicates that the master sensor controller should be a non-master sensor controller; and
in response, assuming a role as the non-master sensor controller.

6. The method of claim 5, wherein assuming the role as the non-master sensor controller comprises waiting to generate any output values until another sync signal is received from a new master sensor controller.

7. The method of claim 6, further comprising:
determining, by the non-master sensor controller, that the mode value for the non-master sensor controller indicates that the non-master sensor controller should be a master sensor controller; and
in response, assuming a role as the master sensor controller.

8. The method of claim 1, wherein the plurality of sensors include one or more of audio sensors, light sensors, or proximity sensors.

9. The method of claim 1, wherein the plurality of sensors include both audio sensors and light sensors.

10. A system comprising:
a plurality of sensor controllers, wherein each sensor controller of the plurality of sensor controllers is configured to implement a respective decimation filter that is configured to generate a single sample output from multiple input samples generated by a corresponding sensor of a plurality of sensors, wherein a non-master sensor controller of the plurality of sensor controllers is configured to perform operations comprising:
while monitoring for a sync signal from a master sensor controller of the plurality of sensor controllers, receiving and storing, by the non-master sensor controller of the plurality of sensor controllers, a plurality of input samples from the corresponding sensor;

upon receiving the sync signal from the master sensor controller, generating, by the non-master sensor controller, a sample output representative of the plurality of input samples received by the sensor while monitoring for the sync signal, wherein generating the sample output comprises applying the respective decimation filter of the non-master sensor controller to the plurality of input samples; and outputting, by the non-master sensor controller, the sample output generated from the plurality of input samples received while monitoring for the sync signal from the master sensor controller.

11. The system of claim 10, wherein each sensor controller of the plurality of sensor controllers comprises a programmable register space comprising a mode value indicating whether or not the sensor controller is the master sensor controller.

12. The system of claim 11, wherein the programmable register space comprises a sync mask that indicates which sensor controller to monitor for sync signals.

13. The system of claim 11, wherein the programmable register space comprises an enable value indicating whether the sensor controller should generate output values.

14. The system of claim 11, wherein the operations further comprise:
determining, by the master sensor controller, that the mode value for the master sensor controller indicates that the master sensor controller should be a non-master sensor controller; and
in response, assuming a role as the non-master sensor controller.

15. The system of claim 14, wherein assuming the role as the non-master sensor controller comprises waiting to generate any output values until another sync signal is received from a new master sensor controller.

16. The system of claim 13, further comprising:
determining, by the non-master sensor controller, that the mode value for the non-master sensor controller indicates that the non-master sensor controller should be a master sensor controller; and
in response, assuming a role as the master sensor controller.

17. The system of claim 10, wherein the plurality of sensors include one or more of audio sensors, light sensors, or proximity sensors.

18. The system of claim 10, wherein the plurality of sensors include both audio sensors and light sensors.

19. The method of claim 1, further comprising:
determining a threshold number of input samples has not been received by the sensor controller; and
in response, storing the input samples in a sensor controller data storage for the sensor controller.

20. The system of claim 10, further comprising:
determining, by the sensor controller, a threshold number of input samples has not been received by the sensor controller; and
in response, storing the input samples in a sensor controller data storage for the sensor controller.

* * * * *